United States Patent
Zhang et al.

(10) Patent No.: US 8,404,070 B2
(45) Date of Patent: Mar. 26, 2013

(54) CARBON NANOTUBE FILM COMPOSITE STRUCTURE, TRANSMISSION ELECTRON MICROSCOPE GRID USING THE SAME, AND METHOD FOR MAKING THE SAME

(75) Inventors: Li-Na Zhang, Beijing (CN); Kai-Li Jiang, Beijing (CN); Rui-Feng Zhou, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 109 days.

(21) Appl. No.: 12/907,533

(22) Filed: Oct. 19, 2010

(65) Prior Publication Data

US 2011/0226413 A1 Sep. 22, 2011

(30) Foreign Application Priority Data

Mar. 17, 2010 (CN) .......................... 2010 1 0126408

(51) Int. Cl.
*B29B 65/00* (2006.01)
*B32B 37/00* (2006.01)
*B32B 38/04* (2006.01)

(52) U.S. Cl. .................... 156/267; 156/73.1; 156/272.8; 997/742; 997/755; 427/596; 427/595; 427/122; 427/331; 427/372.2; 427/306.3; 427/554

(58) Field of Classification Search ................. 156/73.1, 156/267, 256, 272.8; 977/742, 755; 427/596, 427/595, 122, 331, 372.2, 306.3, 554
See application file for complete search history.

(56) References Cited

U.S. PATENT DOCUMENTS

| | | | |
|---|---|---|---|
| 6,787,200 B1 | 9/2004 | Delaunay et al. | |
| 2008/0237464 A1 | 10/2008 | Zhang et al. | |
| 2009/0173334 A1 | 7/2009 | Krs et al. | |
| 2009/0317926 A1 | 12/2009 | Zhang et al. | |
| 2011/0017921 A1 | 1/2011 | Jiang et al. | |
| 2011/0027486 A1* | 2/2011 | Jiang et al. | 427/331 |
| 2011/0117361 A1 | 5/2011 | Hamilton et al. | |

FOREIGN PATENT DOCUMENTS

| | | |
|---|---|---|
| CN | 101276724 | 10/2008 |
| CN | 101964291 | 2/2011 |
| JP | 2003-34512 | 2/2003 |
| JP | 2003-504512 | 2/2003 |
| WO | WO2009061492 | 5/2009 |
| WO | WO2009089268 | 7/2009 |

OTHER PUBLICATIONS

Jannik C. Meyer, C. O. Girit, M. F. Crommie, A. Zettl, Imaging and dynamics of light atoms and molecules on graphene, Nature, Jul. 17, 2008, pp. 319-322, vol. 454.
Jannik C. Meyer, C. Kisielowski, R. Erni, Marta D. Rossell, M. F. Crommie, A. Zettl, Direct Imaging of Lattice Atoms and Topological Defects in Graphene Membranes, NANO Letters, Jun. 19, 2008, pp. 3582-3586, vol. 8, No. 11.

* cited by examiner

*Primary Examiner* — Linda L Gray
(74) *Attorney, Agent, or Firm* — Altis Law Group, Inc.

(57) ABSTRACT

The present invention relates to a method for making a graphene sheet-carbon nanotube film composite structure. The method includes steps of: providing a carbon nanotube film structure and a dispersed solution, and the dispersed solution comprises a solvent and an amount of functionalized graphene sheets dispersed in the solvent; applying the dispersed solution on a surface of the carbon nanotube film structure; and removing the solvent and thereby locating the functionalized graphene sheets on the carbon nanotube film structure. The present invention also relates to a method for making a transmission electron microscope grid.

20 Claims, 11 Drawing Sheets providing a carbon nanotube film structure and a dispersed solution, and the dispersed solution comprises a solvent and an amount of functionalized graphene sheets dispersed in the solvent

↓ applying the dispersed solution on a surface of the carbon nanotube film structure

↓ removing the solvent and thereby locating the functionalized graphene sheets on the carbon nanotube film structure, and achieving a graphene sheet-carbon nanotube film composite structure

↓ placing the graphene sheet-carbon nanotube film composite structure on a supporter

FIG. 2

CARBON NANOTUBE FILM COMPOSITE STRUCTURE, TRANSMISSION ELECTRON MICROSCOPE GRID USING THE SAME, AND METHOD FOR MAKING THE SAME

CROSS-REFERENCE TO RELATED APPLICATIONS

This application claims all benefits accruing under 35 U.S.C. §119 from China Patent Application No. 201010126408.5, filed on 2010 Mar. 17 in the China Intellectual Property Office, the disclosure of which is incorporated herein by reference. This application is related to commonly-assigned application entitled, "CARBON NANOTUBE FILM COMPOSITE STRUCTURE, TRANSMISSION ELECTRON MICROSCOPE GRID USING THE SAME, AND METHOD FOR MAKING THE SAME", filed 2010 Oct. 19, Ser. No. 12/907,508.

BACKGROUND

1. Technical Field

The present disclosure relates to a carbon nanotube film composite structure, a transmission electron microscope grid using the same, and a method for making the same.

2. Description of Related Art

Transmission electron microscopy is one of the most important techniques available for the detailed examination and analysis of very small materials. Transmission electron microscopy provides high resolution imaging and material analysis of thin specimens. In transmission electron microscopy analysis, a transmission electron microscope (TEM) grid is used to support the sample such as specimens. The conventional TEM grid includes a metal grid such as a copper or nickel grid, a porous organic membrane covering on the metal grid, and an amorphous carbon film deposited on the porous organic membrane. However, in practical application, when the size of the specimen corresponds to or is less than the thickness of the supporting film, especially when the specimen is nano in size, the amorphous carbon film induces high background noise in the transmission electron microscopy imaging.

Recently, Zhang et al. disclosed an improved TEM grid in US patent application publication No. US20080237464A1. The TEM grid includes a carbon nanotube film located on the metal grid. In use, the specimens are adsorbed on the sidewalls of the carbon nanotubes of the carbon nanotube film, to avoid the background noise induced by the TEM grid.

However, the loading efficiency for the specimens of the TEM grid disclosed by Zhang et al. is relatively low. Although observation of individual specimens can be done by using the TEM grid, it is not easy to observe the entire distribution of the large amount of specimens distributed in a plane.

What is needed, therefore, is a carbon nanotube film composite structure, and a TEM grid with relatively high loading efficiency, that allows observing an entire population of specimens distributed in a plane, that enables high resolution transmission electron microscopy images to be captured, and method for making the same.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

FIG. 2 is a flow chart of one embodiment of a method for making a TEM grid.

DETAILED DESCRIPTION

The disclosure is illustrated by way of example and not by way of limitation in the figures of the accompanying drawings in which like references indicate similar elements. It should be noted that references to "another", "an", or "one" embodiment in this disclosure are not necessarily to the same embodiment, and such references mean at least one.

Figure 1:
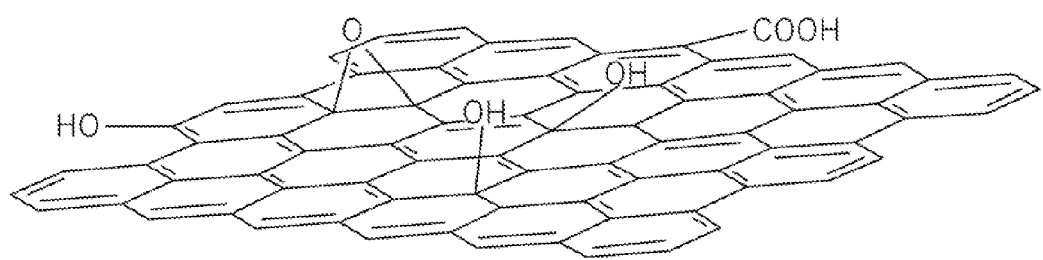
FIG. 1 is a schematic view of a graphene oxide sheet.

Graphite has a multi-layer structure in which two-dimensional atomically fundamental layers are laminated, whereas graphene has a single atomically fundamental layer. In the following description, a very thin graphite is referred to as a graphene sheet, and may include 1 to 10 laminated layers of graphene. The graphene can be covalently or non-covalently functionalized (such as due to electrovalent bonds, hydrogen bonds, and/or π-π bonds) to form a functionalized graphene. The functionalized graphene may include graphene as a basal-plane and one or more functional groups joined to carbon atoms of the graphene. The functionalized graphene sheet includes 1 to 10 laminated layers of functionalized graphene. The one or more functional groups can consist of, for example, oxygen functional groups, nitrogen functional groups, phosphorus functional groups, sulfur functional groups, hydrocarbon functional groups, and halogen functional groups. Referring to FIG. 1, one kind of the functionalized graphene is a graphene oxide which includes one or more oxygen functional groups. The graphene oxide sheet includes 1 to 10 laminated layers of graphene oxide. The oxygen functional groups can be such as carboxyl groups, carbonyl groups, hydroxyl groups, ester groups, aldehyde groups, and epoxy groups. In the functionalized graphene and graphene oxide, the carbon atoms of the graphene are connected to one or more functional groups and oxygen groups respectively.

Referring to FIG. 2, a method for making a TEM grid in one embodiment includes:

(a) providing a carbon nanotube film structure and a dispersed solution, and the dispersed solution comprises a solvent and an amount of functionalized graphene sheets dispersed in the solvent;
(b) applying the dispersed solution on a surface of the carbon nanotube film structure;
(c) removing the solvent and thereby locating the functionalized graphene sheets on the carbon nanotube film structure, and achieving a graphene sheet-carbon nanotube film composite structure; and
(d) placing the graphene sheet-carbon nanotube film composite structure on a support.

In step (a), the carbon nanotube film structure includes a plurality of carbon nanotubes and a plurality of micropores defined by the carbon nanotubes. The carbon nanotube film structure has a film-like structure for supporting the functionalized graphene sheets located thereon. In the carbon nanotube film structure, the carbon nanotubes are oriented in a manner that ensures the plurality of micropores are defined. The functionalized graphene sheets cover the micropores. The carbon nanotube film structure can be free-standing. In one embodiment, the carbon nanotube film structure includes at least two stacked carbon nanotube films aligned along different directions. The carbon nanotubes in the same carbon nanotube film may be aligned substantially along the same direction. In the carbon nanotube film structure, the aligned directions of the carbon nanotubes in different carbon nanotube films may intersect with each other. An angle α can be defined between the aligned directions of the carbon nanotubes of two stacked carbon nanotube films in the carbon nanotube film structure. The carbon nanotube film can be a drawn carbon nanotube film that is formed by drawing from a carbon nanotube array.

A method for making the carbon nanotube film includes: (a11) providing a carbon nanotube array capable of having a film drawn therefrom; and (a12) pulling/drawing out the carbon nanotube film from the carbon nanotube array. The pulling/drawing can be done by using a tool (e.g., adhesive tape, pliers, tweezers, or another tool allowing multiple carbon nanotubes to be gripped and pulled simultaneously).

In step (a11), a given carbon nanotube array can be formed by a chemical vapor deposition (CVD) method. The carbon nanotube array includes a plurality of carbon nanotubes parallel to each other and approximately perpendicular to the substrate. The carbon nanotubes in the carbon nanotube array are closely packed together by van der Waals attractive force. The carbon nanotubes in the carbon nanotube array can be single-walled carbon nanotubes, double-walled carbon nanotubes, multi-walled carbon nanotubes, or combinations thereof. The diameter of the carbon nanotubes can be in the range from about 0.5 nanometers to about 50 nanometers. The height of the carbon nanotubes can be in the range from about 50 nanometers to 5 millimeters. In one embodiment, the height of the carbon nanotubes can be in a range from about 100 microns to 900 microns.

In step (a12), the carbon nanotube film includes a plurality of carbon nanotubes, and there are interspaces between adjacent two carbon nanotubes. Carbon nanotubes in the carbon nanotube film can be substantially parallel to a surface of the carbon nanotube film. The carbon nanotube film can be pulled/drawn by the following substeps: (a121) selecting a carbon nanotube segment having a predetermined width from the carbon nanotube array; and (a122) pulling the carbon nanotube segment at an even/uniform speed to achieve a uniform drawn carbon nanotube film.

In step (a121), the carbon nanotube segment having a predetermined width can be selected by using an adhesive tape as the tool to contact the carbon nanotube array. The carbon nanotube segment includes a plurality of carbon nanotubes parallel to each other. In step (a122), the pulling direction is arbitrary (e.g., substantially perpendicular to the growing direction of the carbon nanotube array).

More specifically, during the pulling process, as the initial carbon nanotube segment is drawn out, other carbon nanotube segments are also drawn out end-to-end due to the van der Waals attractive force between ends of adjacent segments. This process of drawing ensures that a continuous, uniform carbon nanotube film having a predetermined width can be formed. The drawn carbon nanotube film includes a plurality of carbon nanotubes that are arranged substantially parallel to a surface of the drawn carbon nanotube film. A large number of the carbon nanotubes in the drawn carbon nanotube film can be oriented along a preferred orientation, meaning that a large number of the carbon nanotubes in the drawn carbon nanotube film are arranged substantially along the same direction. An end of one carbon nanotube is joined to another end of an adjacent carbon nanotube arranged substantially along the same direction, by van der Waals attractive force. A small number of the carbon nanotubes are randomly arranged in the drawn carbon nanotube film, and has a small if not negligible effect on the larger number of the carbon nanotubes in the drawn carbon nanotube film arranged substantially along the same direction. The carbon nanotube film is capable of forming a free-standing structure. The term "free-standing structure" includes, but not limited to, a structure that does not have to be supported by a substrate. For example, a free-standing structure can sustain the weight of itself when it is hoisted by a portion thereof without any significant damage to its structural integrity. So, if the drawn carbon nanotube film is placed on a hollow support, a portion of the drawn carbon nanotube film at the center, not in contact with the hollow support, would be suspended and yet maintain film structural integrity. The free-standing structure of the drawn carbon nanotube film is realized by the successive carbon nanotubes joined end to end by van der Waals attractive force. In the carbon nanotube film, the adjacent two carbon nanotubes side by side may be in contact with each other or spaced apart from each other. Pores are defined in the carbon nanotube film by adjacent carbon nanotubes.

Figure 3:
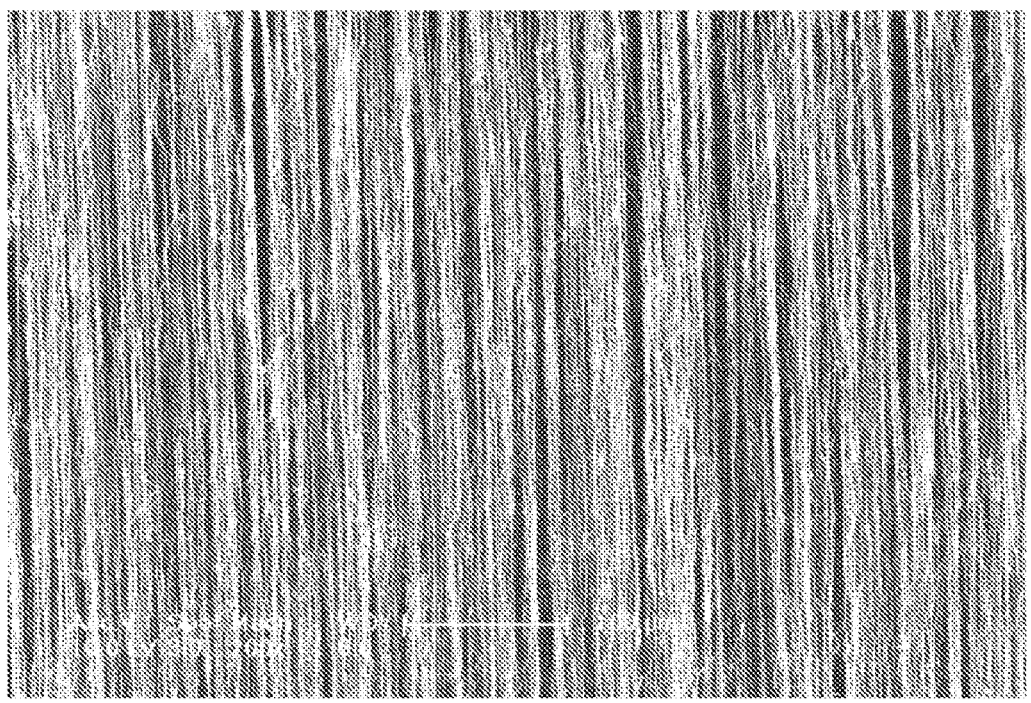
FIG. 3 shows a Scanning Electron Microscope (SEM) image of a carbon nanotube film.

It can be appreciated that some variation can occur in the orientation of the carbon nanotubes in the drawn carbon nanotube film as can be seen in FIG. 3. Microscopically, the carbon nanotubes oriented substantially along the same direction may not be perfectly aligned in a straight line, and some curve portions may exist. It can be understood that a contact between some carbon nanotubes located substantially side by side and oriented along the same direction may not be totally excluded.

More specifically, the drawn carbon nanotube film can include a plurality of successively oriented carbon nanotube segments joined end-to-end by van der Waals attractive force therebetween. Each carbon nanotube segment includes a plurality of carbon nanotubes substantially parallel to each other, and joined by van der Waals attractive force therebetween. The carbon nanotube segments can vary in width, thickness, uniformity and shape. The carbon nanotubes in the drawn carbon nanotube film are also substantially oriented along a preferred orientation.

The at least two carbon nanotube films can be stacked with each other along different directions with the angle α therebetween. A frame can be provided, and a first carbon nanotube film can be secured to the frame. One or more edges of the carbon nanotube film are attached on the frame, and other part of the carbon nanotube film is suspended. A second carbon nanotube film can be placed on the first carbon nanotube film along another direction on the frame. By using the same manner, more than two carbon nanotube films can be stacked with each other on the frame. The carbon nanotube films can be respectively aligned along two or more different directions. The carbon nanotube film structure is a free-standing structure.

Adjacent carbon nanotube films can be combined only by the van der Waals attractive force therebetween (e.g. no need for an adhesive) and a more stable carbon nanotube film structure is formed. The layer number of the carbon nanotube films in the carbon nanotube film structure is not limited. In one embodiment, the carbon nanotube film structure consists of 2 to 4 layers of carbon nanotube films. The angle $\alpha$ between the orientations of carbon nanotubes in the two carbon nanotube films aligned along different directions can be larger than 0 degrees. In one embodiment, the angle $\alpha$ is about 90 degrees.

Figure 4:
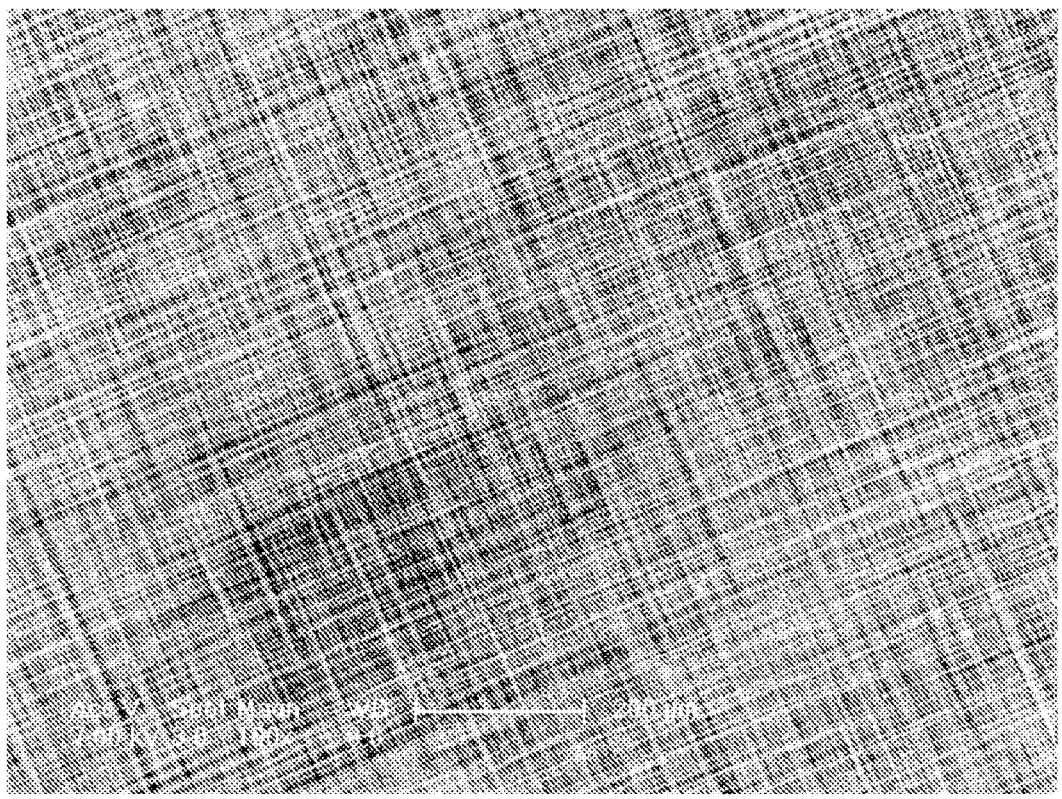
FIG. 4 shows an SEM image of a carbon nanotube film structure including at least two stacked carbon nanotube films of FIG. 2, aligned along different directions.

After forming the carbon nanotube film structure, the step (a) can further include an optional step (g) of treating the carbon nanotube film structure with an organic solvent. After an organic solvent is applied to the carbon nanotube film structure, the organic solvent can be evaporated from the carbon nanotube film structure, to enlarge the pores defined between adjacent carbon nanotubes in the carbon nanotube film structure. The step (g) may also makes the combination between adjacent drawn carbon nanotube films more stable. The organic solvent can be volatile at room temperature and can be selected from the group consisting of ethanol, methanol, acetone, dichloroethane, chloroform, and any combination thereof. In one embodiment, the organic solvent is ethanol. The organic solvent should have a desirable wettability relative to the carbon nanotubes. The step of applying the organic solvent on the carbon nanotube film structure can include a step of dropping the organic solvent on the surface of the carbon nanotube film structure by a dropper and/or a step of immersing the entire carbon nanotube film structure into a container with the organic solvent therein. Referring to FIG. 4, after the organic solvent is evaporated, some of the adjacent parallel carbon nanotubes in the same carbon nanotube film will bundle together, due to the surface tension of the organic solvent when the organic solvent volatilizes. The bundling will create parallel and spaced carbon nanotube strings in each carbon nanotube film. For the reason that the edges of the carbon nanotube film structure can be held by the frame or other holder, the bundling can only occur in microscopic view, and the carbon nanotube film structure will sustain the film shape in macroscopic view. The carbon nanotube strings also include a plurality of carbon nanotubes joined end-to-end by Van der Waals attractive force therebetween. Due to the carbon nanotube films being aligned along different directions, the carbon nanotube strings shrunk from carbon nanotubes in different carbon nanotube films are intersect with each other, and thereby forming the plurality of pores. The size of the pore is ranged from about 1 nanometer to about 10 microns. In one embodiment, the size of the pore ranges from about 1 nanometer to about 900 nanometers. In one embodiment, the carbon nanotube film structure includes 4 layers of drawn carbon nanotube films, the $\alpha$ between each two adjacent drawn carbon nanotube films is 90 degrees, and 60% of the pores are nano in scale. It is to be noted that, the more the layers of carbon nanotube films, the smaller the size of the pores in the carbon nanotube film structure. Thus, by adjusting the number of the carbon nanotube films in the carbon nanotube structure, the desired size of the pores can be achieved to support the functionalized graphene sheets used. It is to be understood that, the step (g) of treating the carbon nanotube film structure with the organic solvent is optional. Additionally, the result of step (g) can be accomplished by having the solvent in the dispersed solution be an acceptable organic solvent.

Further, the carbon nanotube film structure can be functionalized by surface modification to form a functionalized carbon nanotube film structure including one or more functional groups joined to one or more carbon atoms of the carbon nanotubes in the carbon nanotube film structure by covalent bonds. In one embodiment, the drawn carbon nanotube film can be oxidized by an oxidizing agent such as sulfuric acid, potassium chlorate, nitric acid, and potassium permanganate, in a functionalizing solution, to oxidize the sidewall of the carbon nanotubes. The functionalized carbon nanotube film structure and the functionalized graphene sheets can be combined together through the combinations of the functional groups thereof. The combination process can be executed by, for example, causing a condensation reaction between the functional groups.

More specifically, the functionalized graphene sheet includes one or more first functional groups, the functionalized carbon nanotube film structure can include one or more second functional groups. The first functional groups can be combined with the second functional groups through a chemical reaction such as a condensation process, to form one or more third functional groups joined both to the functionalized graphene sheet and the carbon nanotube film structure. Accordingly, a new chemical structure may be formed, which can be represented by FG-$3^{rd}$ group-CNT. The "FG" stands for functionalized graphene. The "$3^{rd}$ group" stands for third functional group. The "CNT" stands for carbon nanotube. The third functional group is joined to the carbon nanotube and the functionalized graphene by covalent bonds. For example, the FG-$3^{rd}$ group-CNT can be FG-COO-CNT, FG-O-CNT, FG-$(CH_2)_n$-CNT, FG-COONH-$(CH_2)_n$-CNT, and so on.

The dispersed solution is obtained by a step of dispersing an amount of functionalized graphene sheets into the solvent. In one embodiment, the method for making the solvent with functionalized graphene sheets dispersed therein includes:

(a21) providing an amount of functionalized graphene sheets;

(a22) disposing the functionalized graphene sheets in the solvent to form a mixture;

(a23) ultrasonically agitating the mixture to uniformly disperse and/or suspend the functionalized graphene sheets in the solvent, thereby achieving the dispersed solution.

In one embodiment, the mixture is ultrasonically agitated for about 15 minutes. It is to be understood that, other methods can be used to disperse the functionalized graphene sheets in the solvent. For example, the mixture can be stirred mechanically.

The solvent in the dispersed solution should be able to allow dispersion of the functionalized graphene sheets and be able to completely evaporate. Ingredients of the solvent can have a small molecular weight. In some embodiments, the solvent can be water, ethanol, methanol, acetone, dichloroethane, chloroform, or combinations thereof. It is to be understood that, in the dispersed solution, the solvent is used as a liquid medium for dispersing the functionalized graphene sheets, and thus, the solvent should not react with the functionalized graphene sheets. The functionalized graphene sheets should not have a chemical reaction with the solvent, or be dissolved in the solvent.

The functionalized graphene sheet can be a single-layer or multi-layer functionalized graphene sheet. In one embodiment, the functionalized graphene sheet includes 1 to 3 layers of functionalized graphene, thus enabling better contrast TEM imaging. The functionalized graphene is a one-atom-thick planar sheet of $sp^2$-bonded carbon atoms that are densely packed in a honeycomb crystal lattice with functional groups connected to the carbon atoms. The size of the functionalized graphene sheet can be very large (e.g., several millimeters). However, the size of the functionalized graphene sheet generally made is less than about 50~100 microns (e.g., less than 1 micron). It is to be understood that, the functionalized graphene sheet and the pore in the carbon nanotube film structure may be rectangle or polygon in shape. In the present specification, the size of the functionalized graphene sheet does not relate to the thickness but represents the maximum linear distance between one point to another point both on the edge of the functionalized graphene sheet. The concentration of the functionalized graphene sheets in the dispersed solution may be less than or equal to about 5% (volume/volume). The functionalized graphene sheet can be the graphene oxide sheet. A molar ratio of the carbon atoms to the oxygen atoms of the graphene oxide sheet can be in a range from about 2:1 to about 3:1.

In step (b), the dispersed solution can be dropped on the surface of the carbon nanotube film structure to soak the surface thereof. It is to be understood that, when the area of the carbon nanotube film structure is relatively large, the entire carbon nanotube film structure can be immersed into the dispersed solution, and then the carbon nanotube film structure can be took out from the dispersed solution.

In one embodiment, the dispersed solution is dropped on the carbon nanotube film structure suspended cross the framework, drop by drop.

Figure 7:
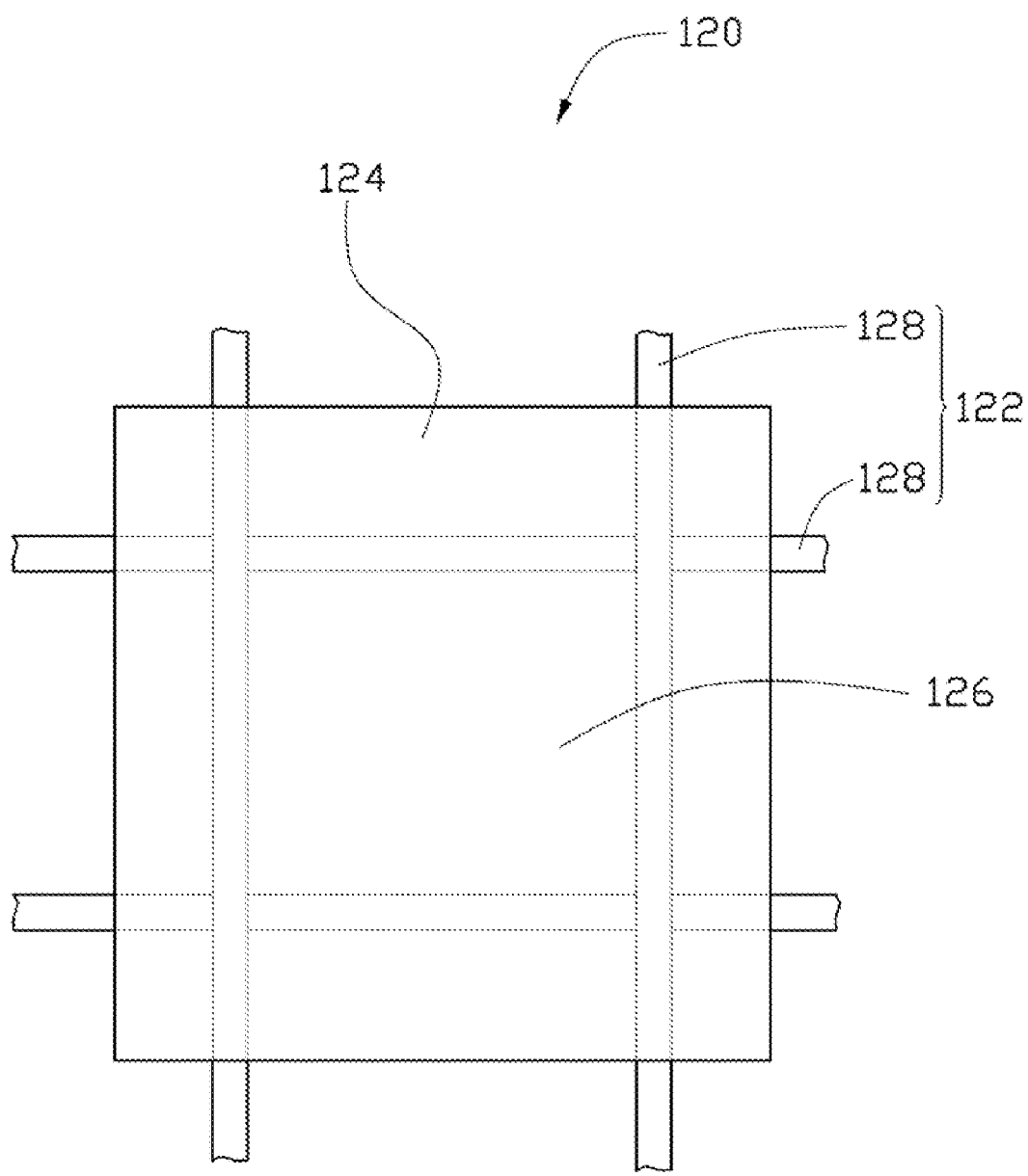
FIG. 7 is a schematic view of an embodiment of the graphene oxide sheet-carbon nanotube film composite structure.

In step (c), after the solvent in the dispersed solution is evaporated, a functionalized graphene sheet layer including one or more functionalized graphene sheets is left on the surface of the carbon nanotube film structure. By placing the functionalized graphene sheets on the carbon nanotube film structure, the functionalized graphene sheets can be adhered to the carbon nanotube film structure by van der Waals attractive force therebetween, to form the composite structure. In some embodiments, the functionalized graphene sheets and the carbon nanotube film structure can be combined by other means. The functionalized graphene sheets in the functionalized graphene sheet layer can be located on the surface of the carbon nanotube film structure in contact with each other, or spaced with each other, according to the concentration of the dispersed solution and amount of the dispersed solution applied on the surface of the carbon nanotube film structure. Referring to FIG. 7, the functionalized graphene sheet-carbon nanotube film composite structure includes at least one functionalized graphene sheet located on at least one pore in the carbon nanotube film structure, in one to one manner.

After the step (b) or step (c), an optional step (h) of placing another carbon nanotube film structure on the surface of the carbon nanotube film structure after having the dispersed solution applied thereon and before or after the solvent is removed, to form a sandwich structure.

It is to be noted that, the other carbon nanotube film structure can include one or more carbon nanotube films having a different or the same structure as the original carbon nanotube film structure. The steps (h), (b) and (c) can be repeated several times, wherein after forming the sandwich structure, the dispersed solution is further dropped on the surface of the sandwich structure, and another carbon nanotube film structure is covered on the sandwich structure. Thus, the multi-layered sandwich structure is formed that includes a plurality of laminated carbon nanotube film structures and the functionalized graphene sheets sandwiched between each two adjacent carbon nanotube film structures. In one embodiment, the sandwich structure includes two carbon nanotube film structures and the functionalized graphene sheets sandwiched therebetween. The carbon nanotube film structures secures the functionalized graphene sheets therebetween.

When a sandwich structure is formed, the functionalized graphene sheets in the functionalized graphene sheet layer are secured by the carbon nanotubes in the two carbon nanotube film structures.

After step (c), an additional step (c1) of treating the functionalized graphene sheet-carbon nanotube film composite structure can be further processed to join the functionalized graphene sheet with the carbon nanotube by a chemical bond.

The step (c1) can be a step of irradiating the functionalized graphene sheet-carbon nanotube film composite structure with a laser or an ultraviolet beam, or a step of bombarding the functionalized graphene sheet-carbon nanotube film composite structure with high-energy particles. After the treating step, the carbon atom in the functionalized graphene sheet and the carbon atom in the carbon nanotube are joined by a $sp^3$ bond, and thus, the functionalized graphene sheets are fixed on the surface of the carbon nanotube film structure firmly. The step (c1) is optional. Without other means, the carbon nanotube and the functionalized graphene sheet are joined by Van der Waals attractive force.

In step (d), the support has at least one through hole. The functionalized graphene sheet-carbon nanotube film composite structure covers the through hole, and is suspended across the through hole. In one embodiment, the support is a grid. The grid can be made of metal or other materials such as ceramics. In one embodiment, the grid is a copper grid.

When the area of the functionalized graphene sheet-carbon nanotube film composite structure is large enough, the step (d) can be replaced with a step (d1). The step (d1) includes steps of: arranging a plurality of supports spaced from each other on a substrate; covering the plurality of supports with one functionalized graphene sheet-carbon nanotube film composite structure; and cutting the functionalized graphene sheet-carbon nanotube film composite structure corresponding to the supports, and thereby producing a plurality of supports with functionalized graphene sheet-carbon nanotube film composite structure thereon at one time. A laser beam can be provided and focused between two adjacent supports. The functionalized graphene sheet-carbon nanotube film composite structure irradiated by the laser beam is burned away. The laser beam has a power of about 5 watts to 30 watts (e.g., about 18 watts).

After the step (d), an optional step (i) of treating the functionalized graphene sheet-carbon nanotube film composite structure on the grid with an organic solvent can be used to better adhere the functionalized graphene sheet-carbon nanotube film composite structure with the support tightly. After being treated by the organic solvent, the area of contact between the carbon nanotube film structure and the support will increase, and thus, the carbon nanotube film structure will more firmly adhere to the surface of the support. The organic solvent can be volatile at room temperature, and can be ethanol, methanol, acetone, dichloroethane, chloroform, or any combination thereof. In one embodiment, the organic solvent is ethanol. The organic solvent should have a desirable wettability to the carbon nanotubes. More specially, the step (i) can include a step of applying the organic solvent on the surface of the functionalized graphene sheet-carbon nanotube film composite structure by using a dropper; or a step of immersing the entire graphene sheet-carbon nanotube film composite structure into a container with the organic solvent therein.

The excess portion of the functionalized graphene sheet-carbon nanotube film composite structure outside the support can be further removed by using a laser beam focused on the excess portion.

Furthermore, an additional step of heating the functionalized graphene sheet-carbon nanotube film composite structure in an inert gas or vacuum can be included. The heating temperature can be in a range from about 100° C. to about 300° C. In one embodiment, the heating temperature is about 200° C. The inert gas can be a nitrogen gas, and/or a noble gas. The conductivity of the functionalized graphene sheet-carbon nanotube film composite structure can be improved by the heating step, to improve the resolution of the TEM imaging when using the TEM grid.

When the carbon nanotube film composite structure is a functionalized carbon nanotube film structure that includes functionalized carbon nanotubes, the heating step can promote a reaction between the functional groups of the functionalized carbon nanotubes and the functional groups of the functionalized graphene sheet. The functional groups of the functionalized carbon nanotubes and the functional groups of the functionalized graphene sheet can be intentionally designed to be capable of chemically reacting with each other.

The method for making the TEM grid has at least the following advantages. Firstly, the carbon nanotube film and the carbon nanotube film structure formed from the carbon nanotube film are free-standing, and can be easily laid and stacked. Two or more carbon nanotube film structures can sandwich the functionalized graphene sheet layer therebetween. Secondly, by using the laser, ultraviolet, or high-energy particles to treat the functionalized graphene sheet-carbon nanotube film composite structure, the functionalized graphene sheets and the carbon nanotube film structure can be combined firmly through chemical bonds. Thirdly, by functionalizing the carbon nanotube film structure, the combination between the functionalized graphene sheets and the functionalized carbon nanotube film structure can be more stable. Fourthly, the carbon nanotube film structure has a large specific surface area, and is adhesive. Therefore, the carbon nanotube film structure can be directly adhered on the surface of the support. Further, by treating with the organic solvent, the carbon nanotube film structure can be more firmly secured to the support. More specifically, the carbon nanotube film structure support will be become better adhered to the support as the organic solvent departs. Additionally, the functionalized graphene sheet-carbon nanotube film composite structure can be covered on a plurality of supports, and forming a plurality of TEM grids at one time.

Figure 5:
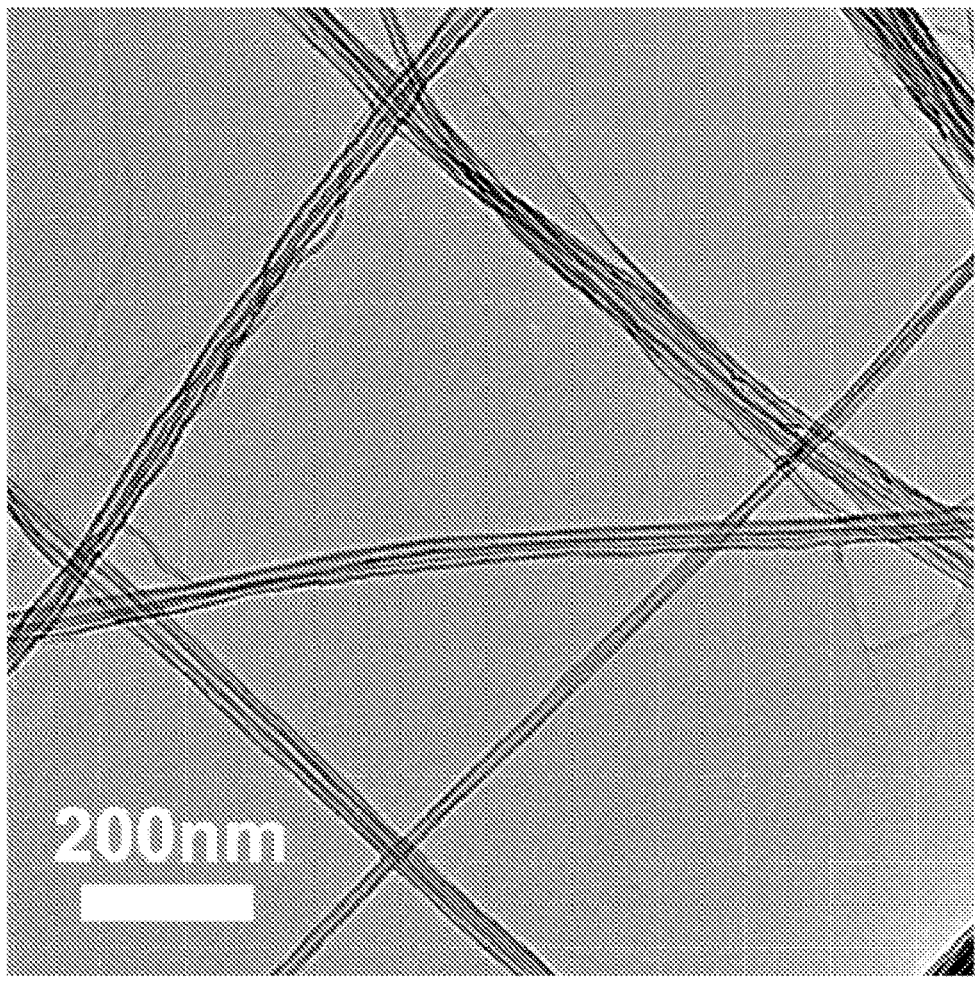
FIG. 5 shows a TEM image of an embodiment of the graphene oxide sheet-carbon nanotube film composite structure.
Figure 6:
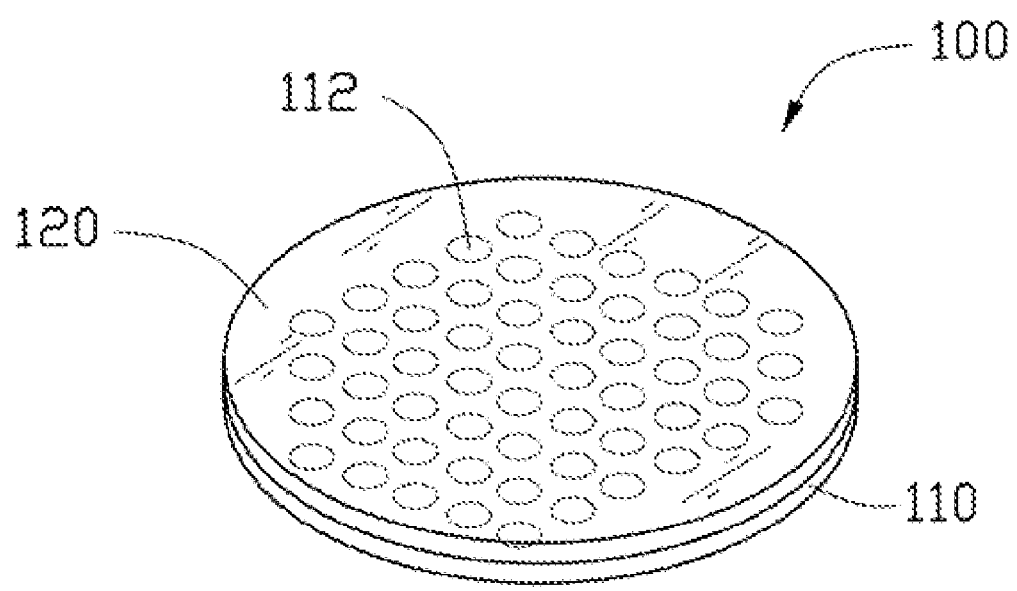
FIG. 6 is a schematic view of an embodiment of the TEM grid formed by the method of FIG. 2.

Referring to FIGS. 5, 6, and 7, a TEM grid 100, which can be made by the above-described method, includes a support 110 and a graphene sheet-carbon nanotube film composite structure 120 covered on the support 110. The graphene sheet-carbon nanotube film composite structure 120 is a functionalized graphene sheet-carbon nanotube film composite structure 120. The graphene sheet-carbon nanotube film composite structure 120 may have a film shape corresponding to the shape of a surface of the support 110.

The graphene sheet-carbon nanotube film composite structure 120 includes at least one carbon nanotube film structure 122 and at least one functionalized graphene sheet 124 disposed on a surface of the carbon nanotube film structure 122. The carbon nanotube film structure 122 includes a plurality of pores 126, wherein at least one pore 126 is covered with a functionalized graphene sheet 124. In one embodiment, one pore 126 is covered with only one functionalized graphene sheet 124. In the use of the TEM grid, the pore 126 is a through hole, to have as few obstruction as possible on the electron transmitting path.

More specifically, the carbon nanotube film structure 122 includes a plurality of carbon nanotubes and a plurality of micropores defined by the carbon nanotubes. The carbon nanotubes in the carbon nanotube film structure 122 can be aligned orderly or disorderly. When the carbon nanotubes are aligned disorderly, the carbon nanotubes can be curved and entangled with each other. When the carbon nanotubes are aligned orderly, the carbon nanotubes can be aligned along one or more directions, while having some variation. The carbon nanotube film structure 122 can further include one or more functional groups covalently connected to the carbon atoms of the carbon nanotubes. The functional groups of the carbon nanotube film structure 122 can be combined with the functional groups of the functionalized graphene sheets.

Referring to FIG. 3 and FIG. 4, the carbon nanotube film structure 122 can include at least two carbon nanotube films stacked with each other. The carbon nanotube film can be drawn from the carbon nanotube array, and includes a plurality of carbon nanotubes aligned substantially along the same direction and parallel to a surface of the carbon nanotube film. The carbon nanotubes in the carbon nanotube film are joined end-to-end by van der Waals attractive force therebetween. In the carbon nanotube film structure 122, some of the carbon nanotube films are aligned along different directions. The angle α exist between the orientation of carbon nanotubes in the two carbon nanotube films. The angle α is in the range of $0°<\alpha\leq 90°$. In one embodiment, α is equal to about 90 degrees. The carbon nanotubes intercrossed with each other at an angle of 90° can define a plurality of rectangular micropores 126, that can be used to establish reference coordinate axes of the specimens during the TEM observation, to conveniently locate and identify the specimens.

Referring to FIGS. 5 and 7, the carbon nanotube film structure 122 includes a plurality of carbon nanotube strings 128 intersecting with each other. The carbon nanotube string 128 includes paralleled carbon nanotubes that are parallel to the length direction of the carbon nanotube string 128. The paralleled carbon nanotubes may be joined end-to-end by van der Waals attractive force therebetween. A plurality of pores 126 are defined by the intercrossed carbon nanotube strings 128, in the carbon nanotube film structure 122. The sizes of the pores 126 are related to the number of layers of the carbon nanotube films in the carbon nanotube film structure 122. The number of layers of carbon nanotube films is not limited. In one embodiment, the carbon nanotube film structure 122 includes 2 to 4 layers of carbon nanotube films. The size of the pores can be in the range from about 1 nanometer to 1 micron. In one embodiment, equal to or more than 60% of the pores are nano in scale.

The functionalized graphene sheet 124 includes one or more layers of functionalized graphene. The functionalized graphene sheet 124 has a size larger than the size of the pore 126 in the carbon nanotube film structure 122 and entirely covers the pore 126. In one embodiment, the functionalized graphene sheet 124 is adhered to the carbon nanotubes of the carbon nanotube film structure 122 by van der Waals attractive force therebetween. The size of the functionalized graphene sheet 124 is in the range from 2 nanometers to 100 microns. In one embodiment, the size of the functionalized graphene sheet 124 is in the range from 2 nanometers to 50 microns. In one embodiment, the functionalized graphene sheet 124 is the graphene oxide sheet which is consisted of 1 to 3 layers of graphene oxide.

Further, a carbon atom in the functionalized graphene sheet 124 and a carbon atom in the carbon nanotube can be joined together by a $sp^3$ bond, to more stably fix the functionalized graphene sheet 124 to the carbon nanotube film structure 122. In another embodiment, when the carbon nanotube film structure 122 includes at least one functional group (i.e. is the functionalized carbon nanotube film structure), the functionalized graphene sheet 124 and the carbon nanotube film structure 122 can be joined together by the third functional groups formed from the combinations between the functional groups of the functionalized graphene sheet 124 and the carbon nanotube film structure 122. The graphene sheet-carbon nanotube film composite structure 120 may include the $FG-3^{rd}$ group-CNT structure. Therefore, the functionalized graphene sheet 124 and the carbon nanotube film structure 122 can be joined by the van der Waals attractive forces, the $sp^3$ bonds between carbon atoms, and/or the combinations of the functional groups between the functionalized graphene sheet 124 and the carbon nanotube film structure 122.

Figure 8:
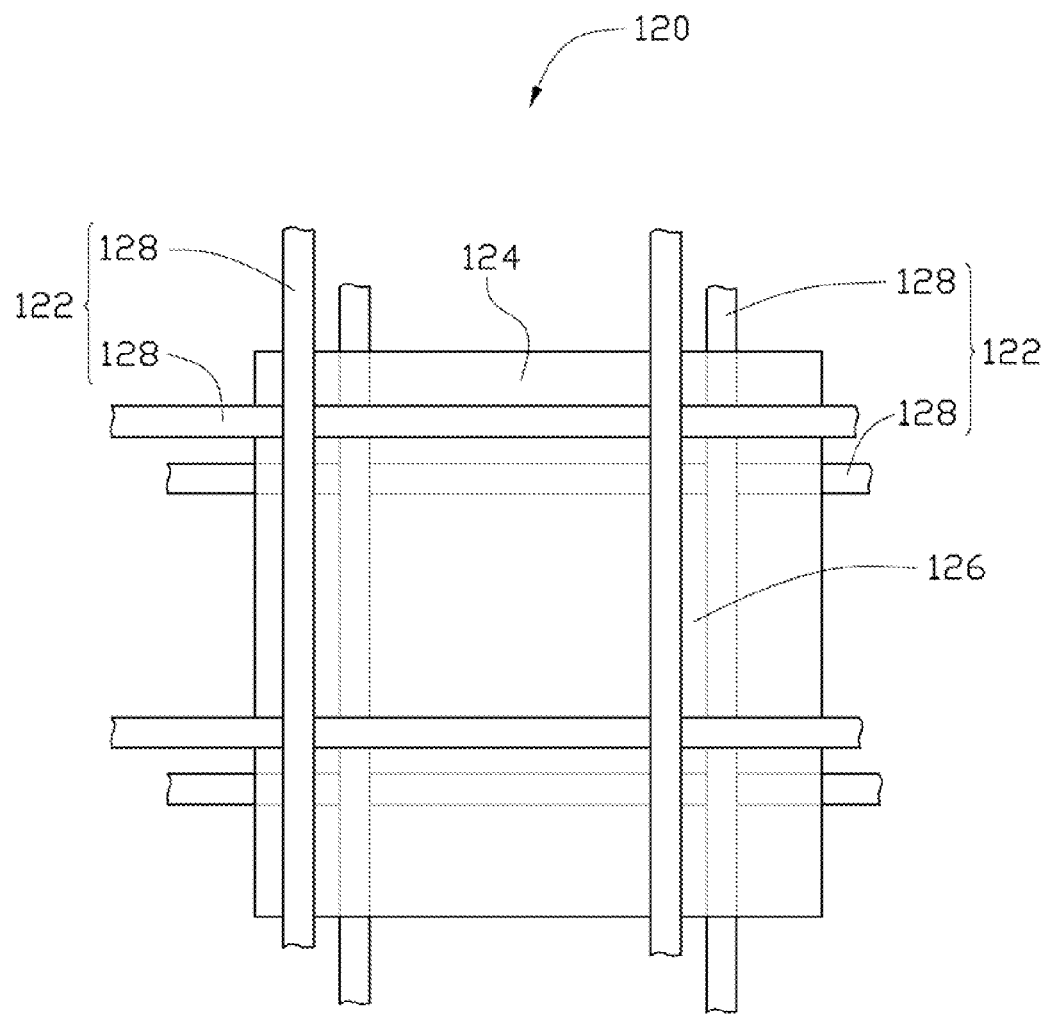
FIG. 8 is a schematic view of another embodiment of the graphene oxide sheet-carbon nanotube film composite structure.

Furthermore, the graphene sheet-carbon nanotube film composite structure 120 can include a plurality of carbon nanotube film structures 122 stacked with each other and a plurality of functionalized graphene sheets 124, disposed between two adjacent carbon nanotube film structures 122. Referring to FIG. 8, the functionalized graphene sheets 124 can be secured by the carbon nanotube strings 128 in the two adjacent carbon nanotube film structures 122 to be firmly held by the carbon nanotube film structures 122.

The support 110 is a sheet defining one or more through holes 112 therein. The material of the support 110 can be metal or other suitable materials such as ceramics and silicon. In one embodiment, the material of the support 110 is copper. The support 110 can be a metal grid used in the conventional TEM grid. The graphene sheet-carbon nanotube film composite structure 120 is located on the surface of the support 110, thereby suspending portions of the graphene sheet-carbon nanotube film composite structure 120 across the through holes 112. In one embodiment, the graphene sheet-carbon nanotube film composite structure 120 is equal in size to the support 110, and covers the entire surface of the support 110. The through holes 112 have a diameter larger than the size of the pores 126 in the carbon nanotube film structure 122, and larger than the size of the functionalized graphene sheet 124. In one embodiment, the diameter of the through holes 112 is in the range from about 10 microns to about 2 millimeters.

Figure 9:
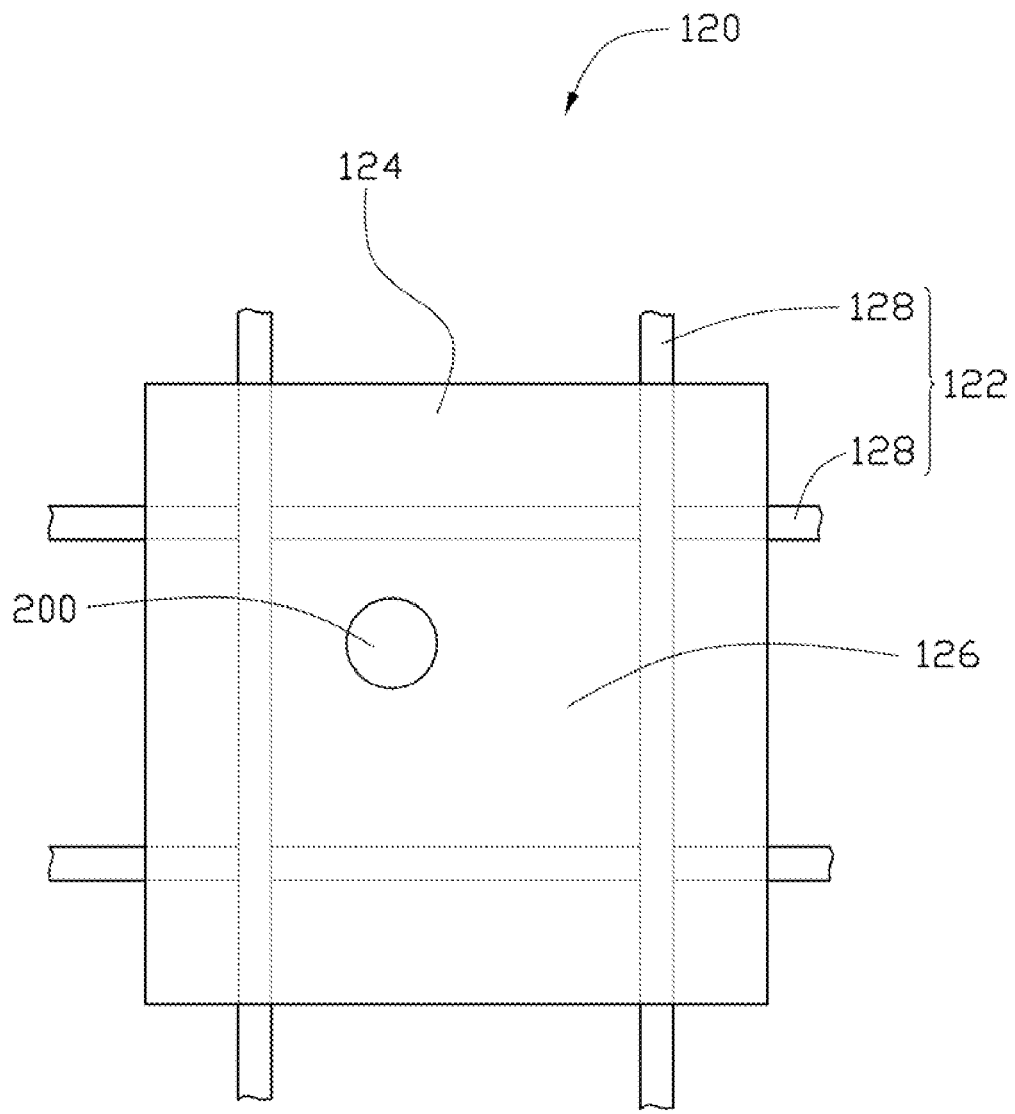
FIG. 9 is a schematic view of an embodiment of the graphene oxide sheet-carbon nanotube film composite structure with a specimen thereon.
Figure 10:
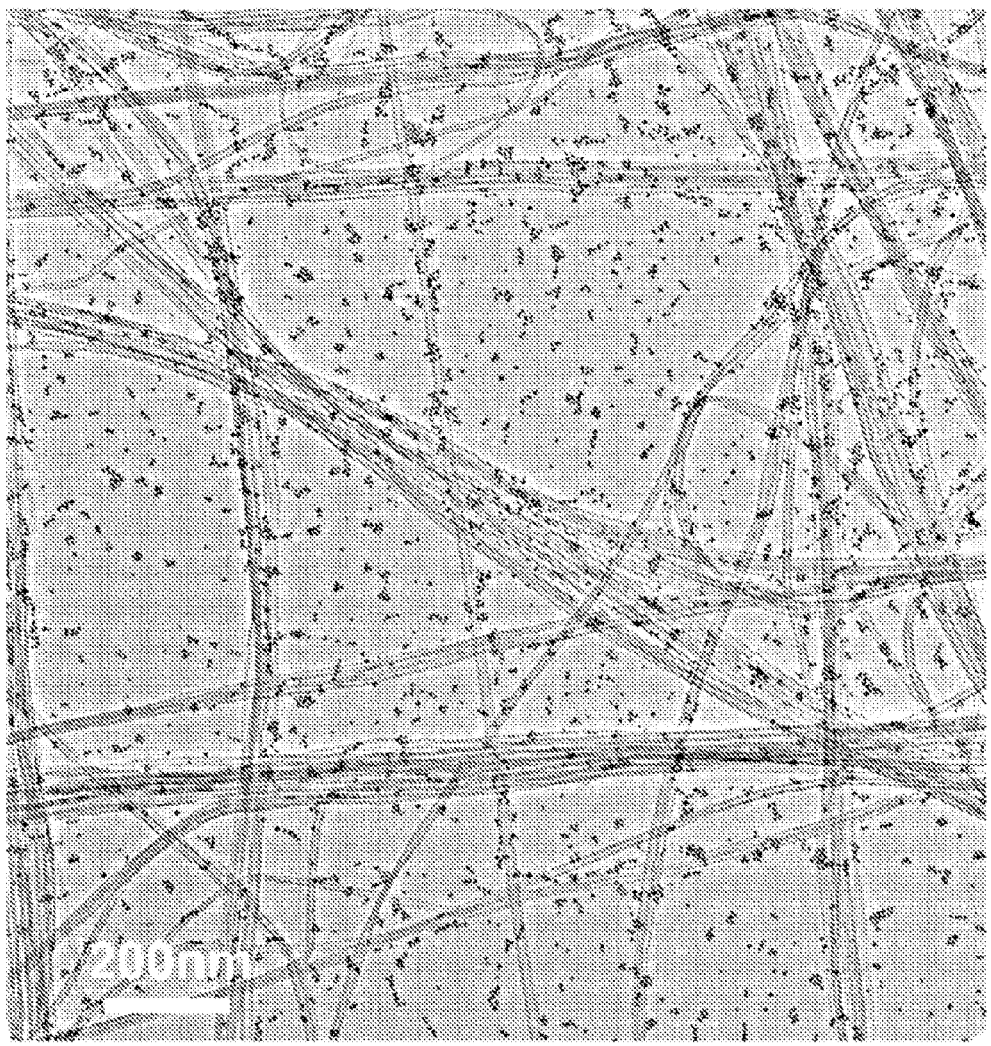
FIG. 10 shows a TEM image of an embodiment with nano-scaled gold particles.
Figure 11:
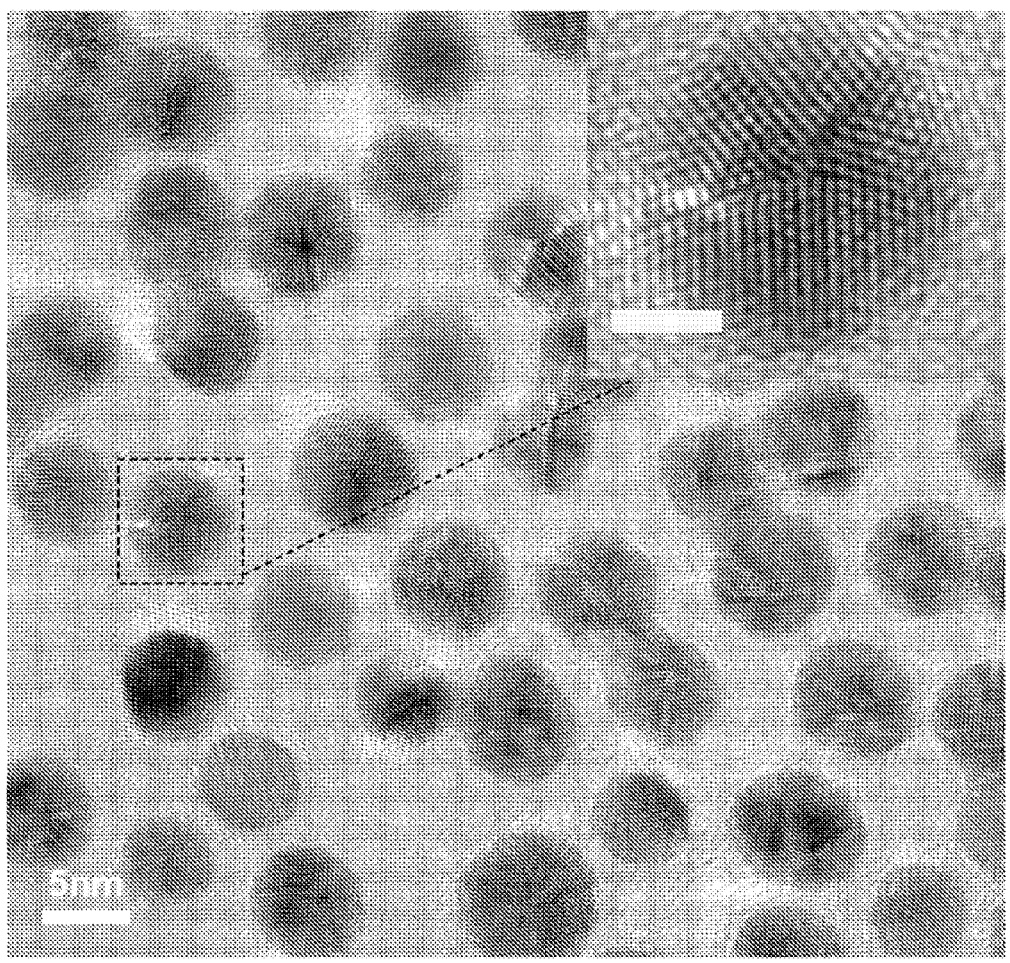
FIG. 11 shows a high resolution TEM image of an embodiment with the nano-scaled gold particles.

The TEM grid 100 is a TEM sample support to support specimen that is to be observed by TEM. In use of the TEM grid 100, a specimen 200 can be disposed on a surface of the TEM grid 100 thereby supported by the TEM grid 100. More specifically, referring to FIGS. 9 and 10, a plurality of specimens 200 are disposed on the surface of the functionalized graphene sheet 124 covered the pore 126 of the carbon nanotube film structure 122. The specimens 200 can be nano-scaled particles, such as nanowires, nanotubes, and nanoballs. The size of a single specimen 200 can be smaller than 1 micron. In one embodiment, the size of the single specimen 200 can be smaller than 10 nanometers. The average size of the specimens 200 can be smaller than 1 micron. Referring to FIGS. 10 and 11, the specimens 200 are an amount of nano-sized metal gold particles. The nano-scaled metal gold particles can be dispersed in a solvent and dropped on the surface of the TEM grid 100. The solvent is dried, and TEM photos with different resolutions can be achieved by using the TEM grid 100. The black particles in FIG. 10 and FIG. 11 are the metal gold particles. In FIG. 11, a gold particle is enlarged and shown at the top-right corner.

The TEM grid 100 has at least the following advantages.

Firstly, the functionalized graphene sheet 124 carries the specimen 200. A large amount of specimens 200 can be uniformly distributed on the surface of the functionalized graphene sheet 124, and the TEM photo can be used to analyze the size distribution of the specimens 200, and observing the self-assembling of the large amount of specimens 200 on the surface of the functionalized graphene sheet 124. The functionalized graphene sheet 124 covers the pore 126, and the specimens 200 are carried by the functionalized graphene sheet 124. Thus, the specimens 200 are uniformly distributed above the pore 126, thereby achieving a maximum carrying probability of the specimens 200. It is to be understood that the size of the single specimen 200 can be slightly smaller than the size of the pore 126.

Secondly, compared to a pristine graphene sheet without any functional groups, the functionalized graphene sheet 124 is prone to flatten on the surface of the carbon nanotube film structure 122 to form a thin and uniform support for the specimens 200 and avoid disturbance to TEM observation of the specimens 200.

Thirdly, a functionalized graphene sheet 124 with a larger size is difficult to form. The pore 126 of the carbon nanotube film structure 122 can be nano in scale (e.g., larger than 1 nanometer and smaller than 1 micron), and thus the functionalized graphene sheet 124 with smaller size can cover the entire pore 126, and avoid uncovering of the pore 126.

Fourthly, the functionalized graphene sheet is very thin. The single layer functionalized graphene has a thickness of about 1 nanometer. Therefore, the background noise during the TEM observation can be lowered, and the TEM photos having higher resolution can be achieved. Further, the smaller the through hole 112 of the support 110 (e.g., below 2 microns), the more complicated the method of manufacture. The TEM grid 100 can use a support 110 with the through hole 112 having a larger diameter. Therefore, the TEM grid 100 has lower cost and complexity.

Fifthly, due to a high purity of the carbon nanotube film drawn from the carbon nanotube array, the TEM grid 100 including the carbon nanotube films do not require elimination of impurities by using a thermal treating step.

Further, the carbon nanotube film structure 122 and the functionalized graphene sheet 124 are both composed of carbon atoms, and have a similar structure (graphene). Thus, the properties of the carbon nanotube film structure 122 and the functionalized graphene sheet 124 is similar. In one embodiment, the carbon nanotube film structure 122 can be joined together with the functionalized graphene sheet 124 by $sp^3$ bonds or the combinations between functional groups. The TEM grid 100 including the $sp^3$ bonds and/or the combinations between the functional groups can be more durable.

Furthermore, in some embodiments, the graphene sheet-carbon nanotube film composite structure 120 can include at least two carbon nanotube film structures 122 securing the functionalized graphene sheets 124 therebetween. Thus, the TEM 100 will have a stable structure and can be more durable.

Depending on the embodiment, certain of the steps of the embodiments of the methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

Finally, it is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

What is claimed is:

1. A method comprising steps of:
providing a carbon nanotube film structure and a dispersed solution, wherein the dispersed solution comprises a solvent and at least one functionalized graphene sheet dispersed in the solvent;
applying the dispersed solution on a surface of the carbon nanotube film structure; and
removing the solvent and thereby locating the at least one functionalized graphene sheet on the carbon nanotube film structure.

2. The method of claim 1, wherein the carbon nanotube film structure comprises a plurality of stacked carbon nanotube films, each of the plurality of stacked carbon nanotube films comprises a plurality of carbon nanotubes aligned substantially along a same direction and joined end-to-end by van der Waals attractive force therebetween.

3. The method of claim 2, wherein each of the plurality of stacked carbon nanotube films is drawn from a carbon nanotube array.

4. The method of claim 1, wherein the at least one functionalized graphene sheet and the carbon nanotube film structure are combined by van der Waals attractive force therebetween.

5. The method of claim 1, further comprising a step of functionalizing the carbon nanotube film structure resulting in a functionalized carbon nanotube film structure comprising at least one second functional group.

6. The method of claim 5, further comprising a step of chemically reacting the functionalized carbon nanotube film structure with the at least one functionalized graphene sheet, wherein the at least one functionalized graphene sheet comprises at least one first functional group.

7. The method of claim 1, further comprising a step of applying a second carbon nanotube film structure on the surface of the carbon nanotube film structure resulting in having the at least one functionalized graphene sheet located between the carbon nanotube film structure and the second carbon nanotube film structure.

8. The method of claim 1, further comprising a step of irradiating the carbon nanotube film structure and the at least one functionalized graphene sheet located on the carbon nanotube film structure with a laser or an ultraviolet beam to form a chemical bond between the at least one functionalized graphene sheet and the carbon nanotube film structure.

9. The method of claim 1, further comprising a step of bombarding the carbon nanotube film structure and the at least one functionalized graphene sheet located on the carbon nanotube film structure with high-energy particles to from a chemical bond between the at least one functionalized graphene sheet and the carbon nanotube film structure.

10. The method of claim 1, further comprising a step of heating the at least one functionalized graphene sheet with the carbon nanotube film structure in an inert gas or vacuum.

11. The method of claim 1, wherein the at least one functionalized graphene sheet comprises a graphene oxide sheet.

12. A method for making a sample-support for transmission electron microscope, comprising steps of:
supplying an apparatus; and
placing the apparatus on a support, wherein the support defines at least one through hole, a portion of the apparatus being suspended above the at least one through hole, and the step of supplying the apparatus comprises steps of:
providing a carbon nanotube film structure and a dispersed solution, wherein the dispersed solution comprises a solvent and at least one functionalized graphene sheet dispersed in the solvent;
applying the dispersed solution on a surface of the carbon nanotube film structure; and
removing the solvent and thereby locating the at least one functionalized graphene sheet on the carbon nanotube film structure.

13. The method of claim 12, wherein the carbon nanotube film structure comprises a plurality of stacked carbon nanotube films, each of the plurality of stacked carbon nanotube films comprises a plurality of carbon nanotubes aligned substantially along a same direction and joined end-to-end by van der Waals attractive force therebetween.

14. The method of claim 13, wherein each of the plurality of stacked carbon nanotube films is drawn from a carbon nanotube array.

15. The method of claim 12, wherein the step of providing the dispersed solution comprises steps of:
adding the at least one functionalized graphene sheet in the solvent to form a mixture; and
ultrasonically agitating the mixture.

16. The method of claim 12, further comprising a step of treating the carbon nanotube film structure with an organic solvent.

17. The method of claim 12, further comprising a step of treating the apparatus located on the support with an organic solvent to tightly adhere the apparatus to the support.

18. The method of claim 12, further comprising a step of removing excess portions of the apparatus.

19. The method of claim 1, wherein the at least one functionalized graphene sheet comprises a graphene and at least one first functional group joined to the graphene.

20. The method of claim 12, wherein the at least one functionalized graphene sheet comprises a graphene and at least one first functional group joined to the graphene.

* * * * *